United States Patent
Wang et al.

(10) Patent No.: US 7,915,059 B2
(45) Date of Patent: Mar. 29, 2011

(54) METHOD FOR FABRICATING ORGANIC LIGHT EMITTING DIODE WITH FLUORINE-ION-DOPED ELECTRODE

(75) Inventors: Shih-Chang Wang, Miao-Li (TW); Jung-Lung Huang, Miao-Li (TW)

(73) Assignee: Chimei Innolux Corporation, Miao-Li County (TW)

(*) Notice: Subject to any disclaimer, the term of this patent is extended or adjusted under 35 U.S.C. 154(b) by 5 days.

(21) Appl. No.: 12/152,023

(22) Filed: May 12, 2008

(65) Prior Publication Data

US 2008/0277654 A1 Nov. 13, 2008

(30) Foreign Application Priority Data

May 11, 2007 (CN) .......................... 2007 1 0074428

(51) Int. Cl.
*H01L 51/00* (2006.01)
(52) U.S. Cl. .................................. 438/22; 257/E51.019
(58) Field of Classification Search ........... 257/E51.019; 313/504; 438/22
See application file for complete search history.

(56) References Cited

U.S. PATENT DOCUMENTS

| | | | |
|---|---|---|---|
| 5,994,836 A | 11/1999 | Boer et al. | |
| 5,998,803 A * | 12/1999 | Forrest et al. | 257/40 |
| 6,023,371 A * | 2/2000 | Onitsuka et al. | 359/620 |
| 6,458,673 B1 | 10/2002 | Cheung | |
| 7,147,937 B2 | 12/2006 | Lussier et al. | |
| 2005/0029932 A1 | 2/2005 | Yang et al. | |
| 2008/0117362 A1* | 5/2008 | Wolk et al. | 349/69 |

FOREIGN PATENT DOCUMENTS

| | | |
|---|---|---|
| CN | 1259733 C | 6/2006 |
| TW | 200631456 A | 9/2006 |
| WO | 00/57446 A1 | 9/2000 |

* cited by examiner

*Primary Examiner* — Matthew S Smith
*Assistant Examiner* — Daniel Shook
(74) *Attorney, Agent, or Firm* — Wei Te Chung

(57) ABSTRACT

An exemplary organic light emitting diode (20) includes a substrate (21), a first electrode (22) with a plurality of fluorinions therein, an organic emission stack (29), and a second electrode (28) sequentially stacked in that order. A related method for fabricating the organic emitting diode is also provided.

8 Claims, 2 Drawing Sheets

METHOD FOR FABRICATING ORGANIC LIGHT EMITTING DIODE WITH FLUORINE-ION-DOPED ELECTRODE

CROSS-REFERENCE TO RELATED APPLICATION

This application is related to, and claims the benefit of, a foreign priority application filed in China as Serial No. 200710074428.0 on May 11, 2007. The related application is incorporated herein by reference.

FIELD OF THE INVENTION

The present invention relates to organic light emitting diodes (OLEDs) and methods for fabricating OLEDs, and particularly to an OLED with a fluorine-ion-doped electrode and a method for fabricating the OLED.

BACKGROUND

OLED devices have begun to gradually replace cathode ray tube displays (CRTs) and liquid crystal displays (LCDs) in the marketplace. This is because OLED devices not only have a thinner profile, wider viewing angle, and less weight, but they also have faster response times and lower power consumption. Another advantage is the relatively simple structure of an OLED device, which typically includes an anode, a cathode, and an organic emission stack positioned therebetween. The simple structure permits the OLED device to be easily fabricated using relatively inexpensive manufacturing processes.

Referring to FIG. 3, a conventional OLED 10 includes a transparent substrate 11, an anode 12, an organic emission stack 19, and a cathode 18 arranged in that order from bottom to top. The organic emission stack 19 includes several layers depending on its functions. The organic emission stack 19 usually includes a hole injection layer 13, a hole transporting layer 14, an emitting layer 15, an electron transporting layer 16, and an electron injection layer 17 arranged in that order from the anode 12 to the cathode 18.

In operation, a positive electrical potential is applied between the anode 12 and the cathode 18. Holes from the anode 12 are injected into the emitting layer 15 through the hole injection layer 13 and the hole transporting layer 14. Electrons from the cathode are injected into the emitting layer 15 through the electron injection layer 17 and the electron transporting layer 16. Accordingly, light beams are generated from the emitting layer 15 as a result of hole-electron recombination within the emitting layer 15.

Generally, the anode 12 is made of a transparent conductive material with a high work function. For example, the anode 12 may be an indium tin oxide (ITO) layer. The hole injection layer 13 is made of organic material. However, a pure ITO layer has a hydrophilic property, and an organic layer has a lipophilic property. Because of these inconsistent properties, the anode 12 and the hole injection layer 13 cannot be combined together firmly. Furthermore, impurities, such as oxygen and water, are liable to be introduced between the anode 12 and hole injection layer 13. These impurities can greatly impair the operability of the OLED 10 and reduce the working lifetime of the OLED 10.

Accordingly, what is needed is an OLED and a method for fabricating the OLED which can overcome the above-described deficiencies.

SUMMARY

In one aspect, an organic light emitting diode includes a substrate, a first electrode with a plurality of fluorine ions therein, an organic emission stack, and a second electrode sequentially stacked in that order.

In another aspect, a method for fabricating an organic light emitting diode includes the steps of: providing a substrate, and forming a first electrode on the substrate; doping a plurality of fluorine ions into the first electrode; forming an organic emission stack on the first electrode; and forming a second electrode on the organic emission stack.

Other novel features and advantages will become more apparent from the following detailed description when taken in conjunction with the accompanying drawings.

DETAILED DESCRIPTION OF PREFERRED EMBODIMENTS

Figure 1:
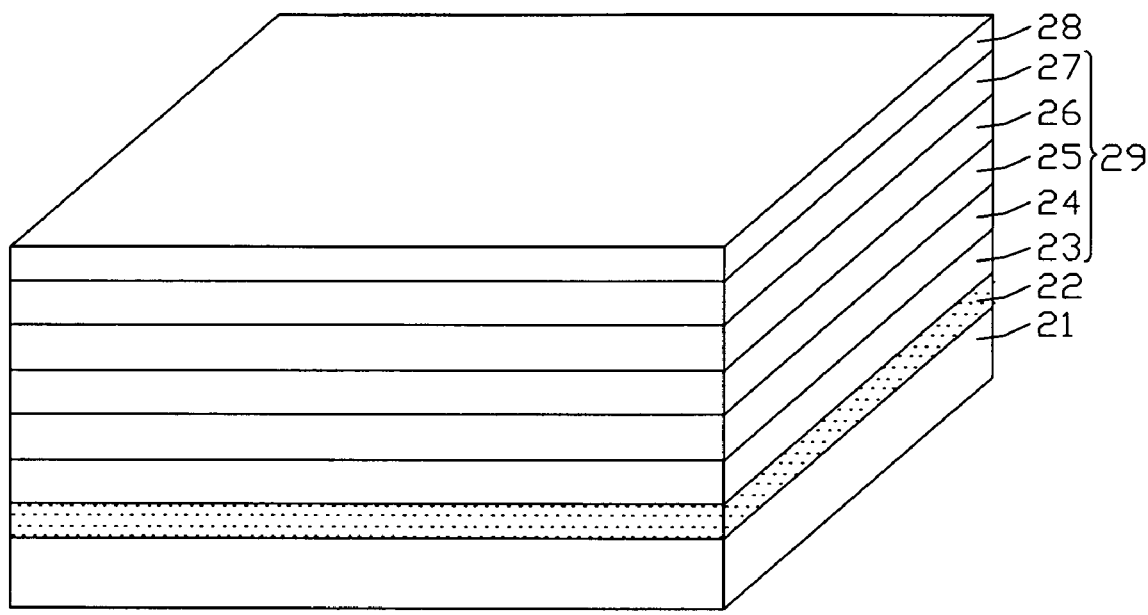
FIG. 1 is a schematic, isometric view of an OLED according to a preferred embodiment of the present invention.

FIG. 1 is a schematic, isometric view of an OLED according to a preferred embodiment of the present invention. The OLED 20 includes a transparent substrate 21, an anode 22, an organic emission stack 29, and a cathode 28 arranged in that order from bottom to top.

The transparent substrate 21 may for example be made of glass, quartz, sapphire or plastic. The anode 22 is made of transparent conductive material selected from indium tin oxide (ITO), indium zinc oxide (IZO), and indium cerium oxide (ICO). A plurality of fluorine ions (not shown) are doped in the anode 22, so as to reduce a hydrophilic property and enhance a hydrophobic property of the anode 22.

The organic emission stack 29 includes several layers depending on its functions. In the illustrated embodiment, the organic emission stack 29 includes a hole injection layer 23, a hole transporting layer 24, an emitting layer 25, an electron transporting layer 26, and an electron injection layer 27 arranged in that order from the anode 22 to the cathode 28.

The cathode 27 is made of a metal or metal alloy. Illustrative metals and metal alloys include, but are not limited to, aluminum (Al), silver (Ag), yttrium (Yt), calcium (Ca), magnesium/silver (Mg/Ag), and the like.

Figure 2:
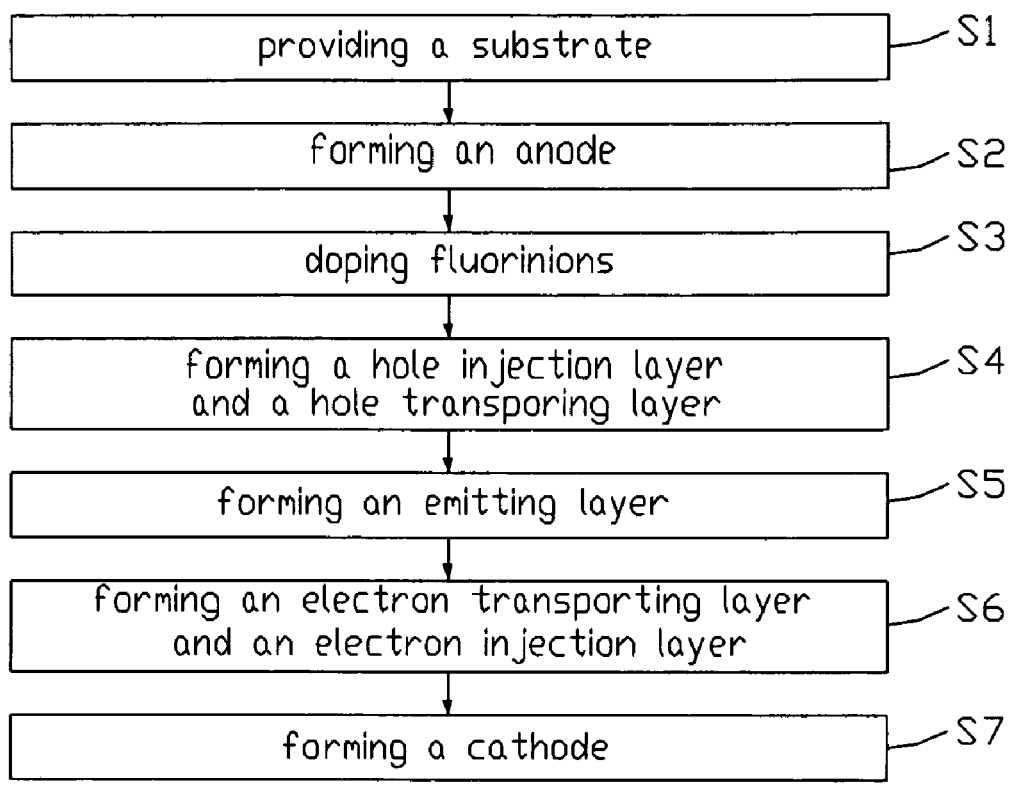
FIG. 2 is a flowchart summarizing an exemplary method for fabricating the OLED of FIG. 1.
Figure 3:
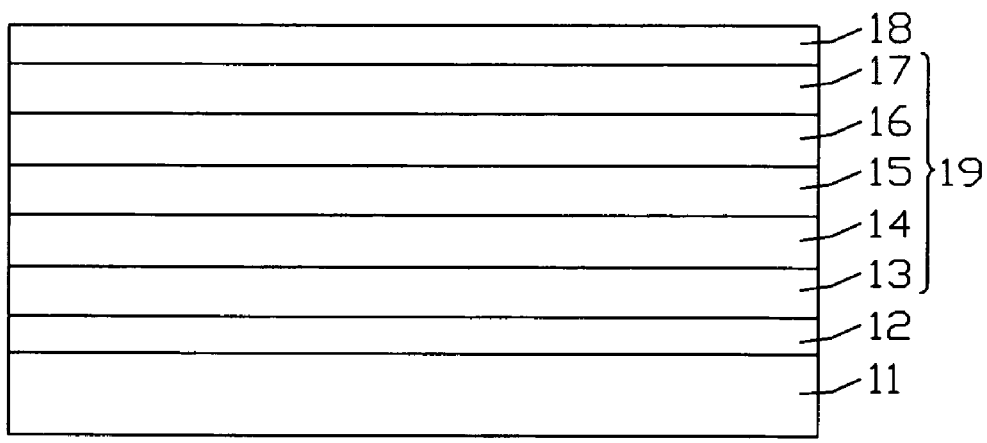
FIG. 3 is a schematic, side cross-sectional view of a conventional OLED.

FIG. 2 is a flowchart summarizing an exemplary method for fabricating the OLED 20. The method includes: step S1, providing a substrate; step S2, forming an anode; step S3, doping fluorine ions; step S4, forming a hole injection layer and a hole transporting layer; step S5, forming an emitting layer; step S6, forming an electron transporting layer and an electron injection layer; and step S7, forming a cathode.

In step S1, the substrate 21 is provided. The substrate 21 is made of transparent material such as glass, quartz, sapphire or plastic.

In step S2, a transparent conductive film, such as an ITO film, an IZO film, or an ICO film, is formed on the substrate 21, thereby obtaining the anode 22. The anode 22 can be formed through any one of a deposition process, a sputtering process, a vacuum vapor deposition process, and the like.

In step S3, a plurality of fluorine ions (not shown) are doped into the anode 22. The fluorine ions can be doped into the anode by an ion diffusion method or ion implantation method in a vacuum environment. Then a thermal activation process is performed on the anode 22, in order to cure defects formed during the doping process.

After the fluorine ions are doped into the anode 22, a solvent cleaning process is performed on the anode 22. The cleaning process can be one or more of an ultrasonic cleaning process, a heat treatment process, a plasma treatment process using hydrogen, oxygen, ozone, etc., an ultraviolet-ozone (UV-ozone) treatment process, and/or a silane treatment process. Such cleaning processes clean impurities from the anode 22, and lower an electronic energy level of the anode 22. This facilitates electron injection into an ionization energy level of an upper organic layer formed in a subsequent step. Such cleaning processes also improve the interface properties between the anode 22 and an organic layer subsequently formed on the anode 22.

In step S4, the hole injection layer 23 and the hole transporting layer 24 are sequentially formed on the anode 22. The hole injection layer 23 is made of a material selected from copper phthalocyanine (CuPc) and 4,4',4"-tris(N-(3-methylphenyl)-N-phenylamino)triphenylamine (MTDATA). The hole transporting layer 25 is made of N,N'-di(1-naphthyl)-N,N'-diphenyl-benzidine (NPD), or the like. The hole injection layer 23 and the hole transporting layer 24 helpful to provide the OLED 20 with a low starting voltage, and enhance a stability of the OLED 20.

In step 5, an organic layer (not labeled) is formed on the hole transporting layer 24. The organic layer can for example be made of an organic polymer material, or a non-polymer material, or the like. The organic layer is formed by a method selected from a spin coating method, a vacuum vapor deposition method, a laser-induced thermal imaging method, and the like. The organic layer is then patterned, thereby forming the emitting layer 25.

In step S6, the electron transporting layer 26 and the electron injection layer 27 are sequentially formed on the emitting layer 25. The electron transporting layer 26 can for example be made of a material selected from a polycyclic hydrocarbon-based derivative, a heterocyclic compound, an aluminum complex, a gallium complex, any derivative of the foregoing, and the like. The electron injection layer 27 can for example be made of a material selected from alkali metals and alkali compounds with low work function, such as calcium, magnesium or lithium fluoride.

In step S7, a transparent conductive layer with low work function is formed on the electron injection layer 27, thereby obtaining the cathode 28. A thickness of the cathode 28 is in a range of 5 nm (nanometers) to 30 nm. The cathode 28 can for example be made of metals and metal alloys, such as Al, Ag, Yt, Ca, Mg/Ag, and the like.

In the above-described described OLED 20 and method for fabricating the OLED 20, a plurality of fluorine ions are doped into the anode 22. The fluorine ions enable the anode 22 to have a hydrophobic property. Accordingly, the anode 22 has an improved surface property. In particular, the anode 22 can be firmly combined with the organic emission stack 29, and few or even no impurities are liable to be introduced between the anode 22 and the hole injection layer 23. The fluorine-ion-doped anode 22 enhances the operability and prolongs a working lifetime of the OLED 20.

It is to be understood, however, that even though numerous characteristics and advantages of the present embodiments have been set out in the foregoing description, together with details of the structures and functions of the embodiments, the disclosure is illustrative only; and that changes may be made in detail, especially in matters of shape, size, and arrangement of parts within the principles of the invention to the full extent indicated by the broad general meaning of the terms in which the appended claims are expressed.

What is claimed is:

1. A method for fabricating an organic light emitting diode, the method comprising:
   providing a substrate, and forming a first electrode on the substrate;
   doping a plurality of fluorine ions into a surface of the first electrode;
   forming an organic emission stack on the first electrode; and
   forming a second electrode on the organic emission stack,
   wherein the fluorine ions are doped into the first electrode after the first electrode is formed on the substrate.

2. The method for fabricating an organic light emitting diode of claim 1, wherein the fluorine ions are doped into the surface of the first electrode by an ion diffusion method or an ion implantation method.

3. The method for fabricating an organic light emitting diode of claim 1, wherein the forming of the organic emission stack comprises: forming a hole injection layer on the first electrode; forming a hole transporting layer on the hole injection layer; forming an emitting layer on the hole transporting layer, forming an electron transporting layer on the emitting layer; and forming an electron injection layer on the electron transporting layer.

4. The method for fabricating an organic light emitting diode of claim 3, wherein the hole injection layer is made of copper phthalocyanine or 4,4',4"-tris(N-(3-methylphenyl)-N-phenylamino)triphenylamine, and the hole transporting layer is made of N,N'-di(1-naphthyl)-N,N'-diphenyl-benzidine.

5. The method for fabricating an organic light emitting diode of claim 3, wherein the emitting layer is formed by a method selected from the group consisting of a spin coating method, a vacuum vapor deposition method, and a laser-induced thermal imaging method.

6. The method for fabricating an organic light emitting diode of claim 3, wherein the electron transporting layer is made of material selected from the group consisting of a polycyclic hydrocarbon-based derivative, a heterocyclic compound, an aluminum complex, a gallium complex, and any derivative thereof, and the electron injection layer is made of material selected from the group consisting of alkali metals and alkali compounds.

7. The method for fabricating an organic light emitting diode of claim 1, wherein the first electrode is an anode, which is made of material selected from the group consisting of indium tin oxide, indium zinc oxide, and indium cerium oxide.

8. The method for fabricating an organic light emitting diode of claim 1, wherein the second electrode is a cathode, which is made of material selected from the group consisting of aluminum, silver, yttrium, calcium, and magnesium/silver alloy.

* * * * *